US006548940B1

(12) United States Patent
Heinouchi

(10) Patent No.: US 6,548,940 B1
(45) Date of Patent: Apr. 15, 2003

(54) SPEAKER

(75) Inventor: Yoshiaki Heinouchi, Jouyou (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/323,560

(22) Filed: Jun. 1, 1999

(30) Foreign Application Priority Data

Jul. 2, 1998 (JP) .......................................... 10-187241

(51) Int. Cl.[7] .............................................. H01L 41/08
(52) U.S. Cl. ...................................................... 310/348
(58) Field of Search ................................ 310/328, 330, 310/331, 348

(56) References Cited

U.S. PATENT DOCUMENTS 2,105,010 A * 1/1938 Sawyer ....................... 310/331
2,457,145 A * 12/1948 Gray .......................... 310/348
4,471,259 A * 9/1984 Stoermer et al. ........... 257/420
5,430,345 A * 7/1995 Takahashi .................... 310/344
5,731,428 A * 3/1998 Fung et al. .............. 424/185.1
6,204,593 B1 * 3/2001 Takahashi et al. .......... 310/340
2001/0045792 A1 * 11/2001 Takeshima .................. 310/340

FOREIGN PATENT DOCUMENTS

| | | | |
|---|---|---|---|
| JP | 61208399 | 9/1986 | |
| JP | 63-55700 | 4/1988 | ........... H04R/17/00 |
| JP | 2-79700 | 6/1990 | ........... H04R/17/10 |

* cited by examiner

*Primary Examiner*—Thomas M. Dougherty
(74) *Attorney, Agent, or Firm*—Keating & Bennett, LLP

(57) ABSTRACT

A speaker is constructed such that a vibrator contained therein is easily positioned, and peeling of the vibrator from a cushioning material provided on a supporting member which supports the vibrator is prevented. A rim of a metal plate which defines the vibrator, and a portion of a first main surface of the metal plate located near the rim clip into a step provided in the cushioning material, which is secured to the supporting member. Furthermore, an adhesive member and the cushioning material are arranged to extend on a second main surface of the metal plate.

18 Claims, 4 Drawing Sheets

SPEAKER

BACKGROUND OF THE INVENTION

1. Field of the Invention

The present invention relates to a speaker including a bimorph vibrator.

2. Description of the Related Art

The structure of a conventional speaker including a bimorph vibrator will be explained with respect to FIG. 6 and FIG. 7.

In FIG. 6 and FIG. 7, a speaker 1 includes a vibrator 2 supported on and secured to a supporting member 5 with a cushioning material 6 disposed between the vibrator 2 and the supporting member 5. The vibrator 2 is a bimorph vibrator and includes a first piezoelectric element 4*a* and a second piezoelectric element 4*b*, which are respectively bonded by an adhesive to a first main surface 3*a* and a second main surface 3*b* of a dish-shaped metal plate 3. The first and second piezoelectric elements 4*a* and 4*b* include a dish-shaped body made of a piezoelectric material, such as ceramic, and are polarized in a direction that is parallel to the thickness thereof.

Furthermore, the cushioning material 6 is made of a flat plate-shaped elastic material, such as rubber. The supporting member 5 is made of a ring-shaped synthetic resin or the like, and has a ring-shaped step portion 5*a* on one main surface 51 thereof. The supporting member 5 includes a through-hole 5*b*, running from the inner wall 52, passing below the step 5*a* and extending to the main surface 51.

The cushioning material 6 is securely affixed to the step 5*a* of the supporting member 5 via an adhesive (not shown in FIG. 6 or FIG. 7). Moreover, a portion near the rim 3*c* of one main surface 3*a* of the metal plate 3, which forms the vibrator 2, is affixed to the top surface of the cushioning material 6 via an adhesive 7, which is made of an elastic material such as silicon or urethane, whereby the vibrator 2 is supportively secured on the supporting member 5.

Furthermore, electrodes 9*a* and 9*b* are provided respectively on the surfaces of the first and second piezoelectric elements 4*a* and 4*b*, which form the vibrator 2, thereby providing a driving element for vibrating the vibrator 2. Ends of conducting wires 10*a* and 10*b* are connected via solder members 11*a* and 11*b* to the electrodes 9*a* and 9*b*, and other ends of the conducting wires 10*a* and 10*b* are connected to an input terminal (not shown in FIG. 6 or FIG. 7) of the speaker 1. The conducting wire 10*b* passes through the through-hole 5*b*, provided in the supporting member 5, and extends outside of the supporting member 5.

In the speaker 1 having the construction described above, when an electrical signal is input to the input terminal, the vibrator 2 vibrates, whereby sound waves are emitted from the outer surface of the vibrator 2.

However, in the conventional speaker 1, since the portion near the rim 3*c* of the main surface 3*a* of the metal plate 3, which forms the vibrator 2, is securely affixed to the surface of the flat plate-like cushioning material 6, it is very difficult to position the vibrator 2 during assembly, and there is a danger that the vibrator 2 will deviate from its predetermined, desired position on the supporting member 5.

Furthermore, the bond between the metal plate 3 and the cushioning material 6, achieved by the adhesive 7, may become loose due to the large amplitude of the vibrator 2, especially when the speaker 1 is used in a woofer of acoustic equipment, and as a result, the vibrator 2 is separated or peels away from the cushioning material 6. Similarly, there is a danger that the vibrator 2 will peel away from the cushioning material 6 when the vibrator 2 has expanded or shrunk due to application of heat.

SUMMARY OF THE INVENTION

To overcome the problems described above, preferred embodiments of the present invention provide a speaker in which a vibrator is easily positioned during assembly of the speaker and the vibrator is not separated from and does not peel away from a cushioning material provided on a supporting member which supports the vibrator.

According to a preferred embodiment of the present invention, a speaker includes a vibrator having a first piezoelectric element bonded to a first main surface of a metal plate and a second piezoelectric element bonded to a second main surface of in the metal plate, a supporting member having a step portion, and a cushioning material provided in the step portion of the supporting member. The speaker is preferably formed by affixing the metal plate to the cushioning material using an adhesive member, and supportively securing the vibrator on the supporting member, wherein a step is provided in the cushioning material, clipping the rim of the metal plate and a portion near the rim of a first main surface into the step provided in the cushioning material, and both or either one of the rim of the metal plate and the portion near the rim of the first main surface being affixed to the step of the cushioning material using an adhesive member.

Preferably, in this preferred embodiment, a reinforcing member is provided at a portion extending over a second main surface of the metal plate, the adhesive member and the cushioning material, or a portion extending over the second main surface of the metal plate and the adhesive member.

In this case, the same material used to form the adhesive member is preferably used to form the reinforcing member.

According to the speaker of preferred embodiments of the present invention, a step is provided in a cushioning material which is secured to a supporting member, and a side of a first main surface a metal plate which defines a vibrator, clips into the step, thereby making it very easy to position the vibrator during assembly of the speaker.

Furthermore, the vibrator is more strongly secured to the cushioning material by providing an adhesive member at a portion of the second main surface of the metal plate, which extends over the vibrator, the adhesive member and the cushioning material, or alternatively, a portion of the second main surface of the metal plate, which extends over the vibrator, and therefore, when the vibrator vibrates with comparatively large amplitude, or when the vibrator expands or shrinks due to heat, separation and peeling of the vibrator from the cushioning material is prevented.

When the same material used to form the adhesive member which affixes the cushioning material to the first main surface of the metal plate which defines the vibrator, is provided to define the reinforcing device, since these adhesive members have the same thermal expansion coefficient, they do not crack when they expand or shrink due to heat.

For the purpose of illustrating the invention, there is shown in the drawings. several forms which are presently preferred, it being understood, however, that the invention is not limited to the precise arrangements and instrumentalities shown.

DETAILED DESCRIPTION OF PREFERRED EMBODIMENTS

Figure 6:
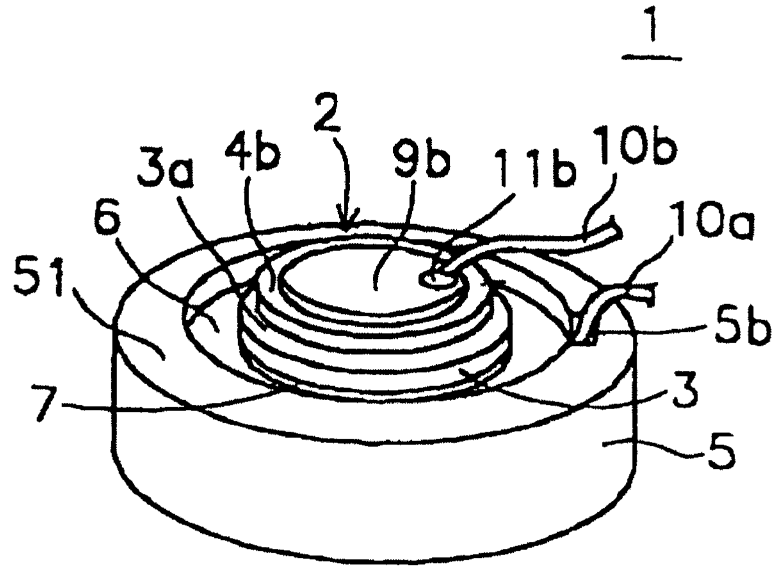
FIG.6 PRIOR ART
FIG. 6 is a perspective view of a conventional speaker.
Figure 7:
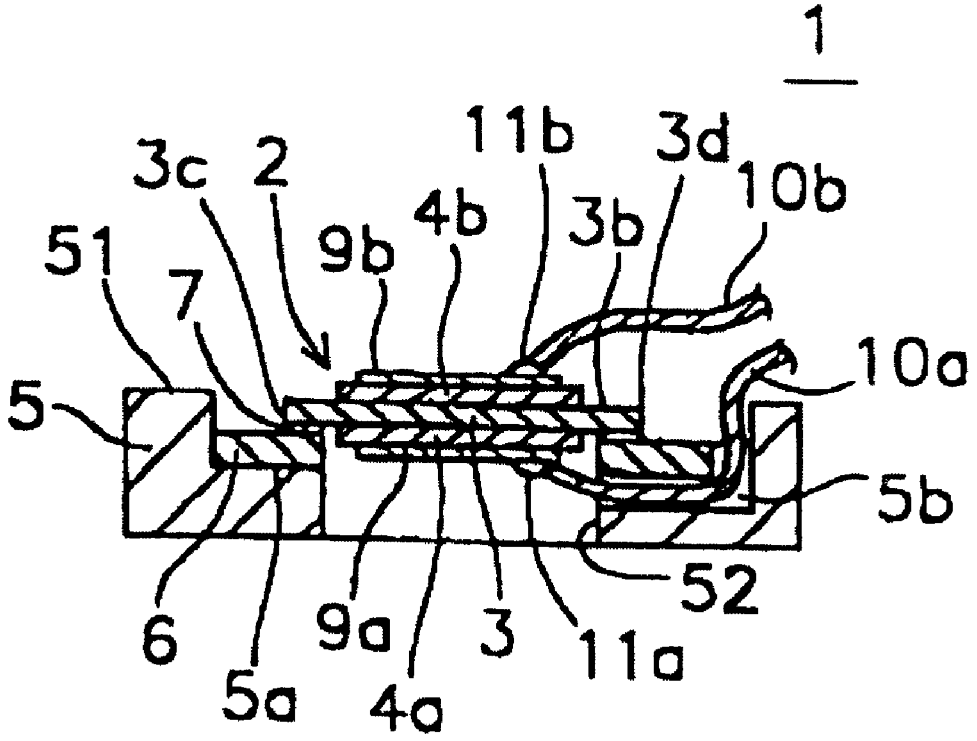
FIG. 7 PRIOR ART
FIG. 7 is a cross-sectional view of the speaker of FIG. 6.

A structure and arrangement of a speaker according to a first preferred embodiment of the present invention will be explained with reference to FIG. 1 and FIG. 2. In these Figures, the same reference characters are used to indicate the same or corresponding elements as shown in FIG. 6 and FIG. 7, and detailed explanation of the similar elements is omitted.

Figure 1:
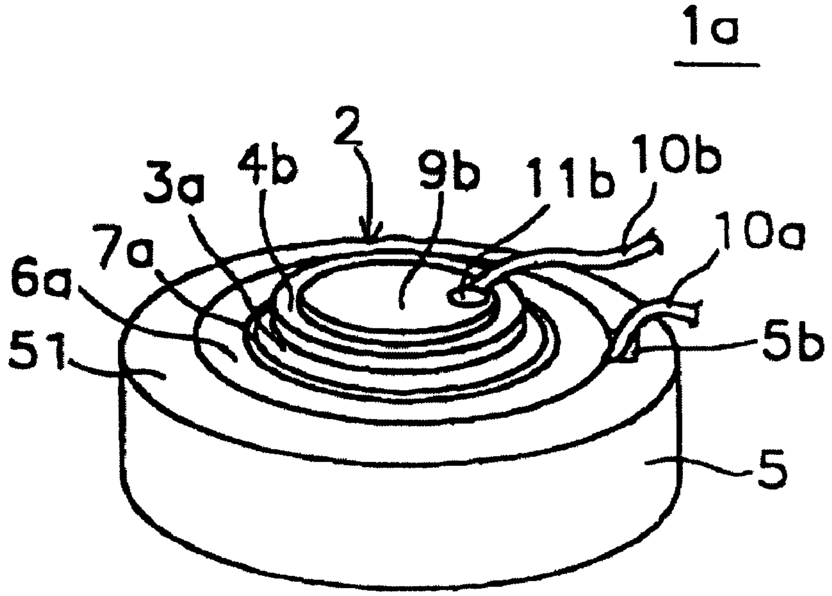
FIG. 1 is a perspective view of a speaker according to a first preferred embodiment of the present invention.
Figure 2:
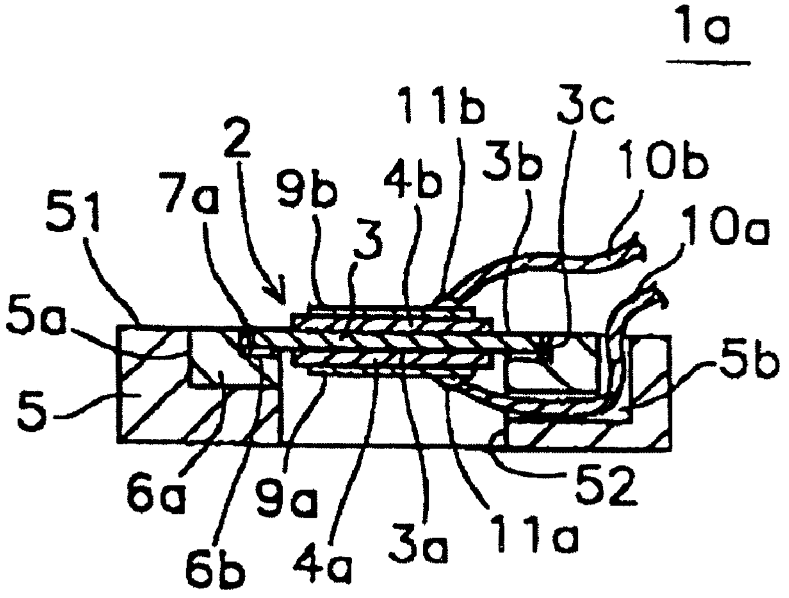
FIG. 2 is a cross-sectional view of the speaker of FIG. 1.

As seen in FIG. 1 and FIG. 2, a speaker 1*a* according to a preferred embodiment of the present invention includes a vibrator 2 which is supported and secured on a supporting member 5 and a cushioning material 6*a* in between the vibrator 2 and the supporting member 5. A step 6*b* is provided in the cushioning material 6*a* and a portion near the rim 3*c* of the metal plate 3, which defines the vibrator 2, and the rim 3*c* of the main surface 3*a* of the metal plate 3 clips into the step 6*b*. Furthermore, the entire contact surfaces of the metal plate 3 and the step 6*b* of the cushioning material 6*a* are affixed using an elastic adhesive member 7*a*.

As described above, in the speaker 1*a*, the vibrator 2 is easily positioned by clipping a first main surface side of the metal plate 3, which defines the vibrator 2, into the step 6*b*, provided in the cushioning material 6*a*.

The first preferred embodiment describes a preferred embodiment in which an adhesive member 7*a* is arranged to extend over the entire contact surfaces of the metal plate 3 and the step 6*b* of the cushioning material 6*a*. Alternatively, either the rim 3*c* of the metal plate 3 or a portion near the rim 3*c* of the main surface 3*a* thereof may be affixed to a portion corresponding to the step 6*b*, using the adhesive member 7*a*.

Next, a speaker according to a second preferred embodiment of the present invention will be explained with reference to FIG. 3 and FIG. 4. In these FIGS. 3 and 4, the same reference characters used for the same or corresponding elements as those contained in FIG. 1 and FIG. 2, and detailed explanation of similar elements is omitted.

Figure 3:
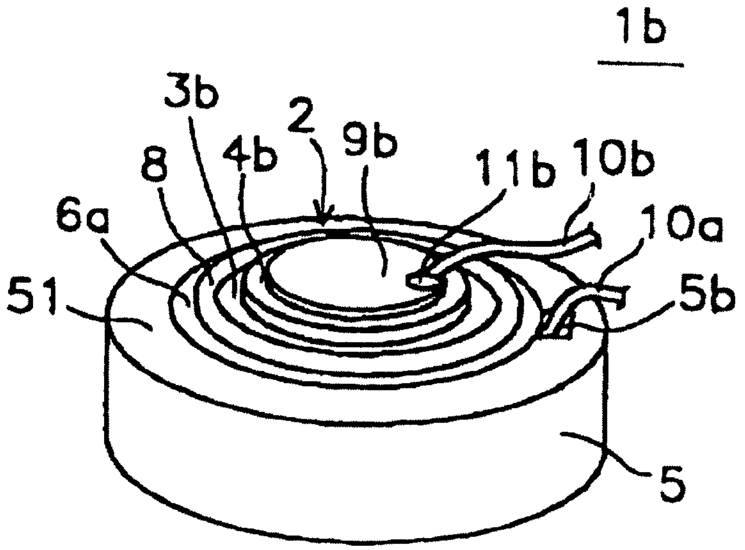
FIG. 3 is a perspective view of a speaker according to a second preferred embodiment of the present invention.
Figure 4:
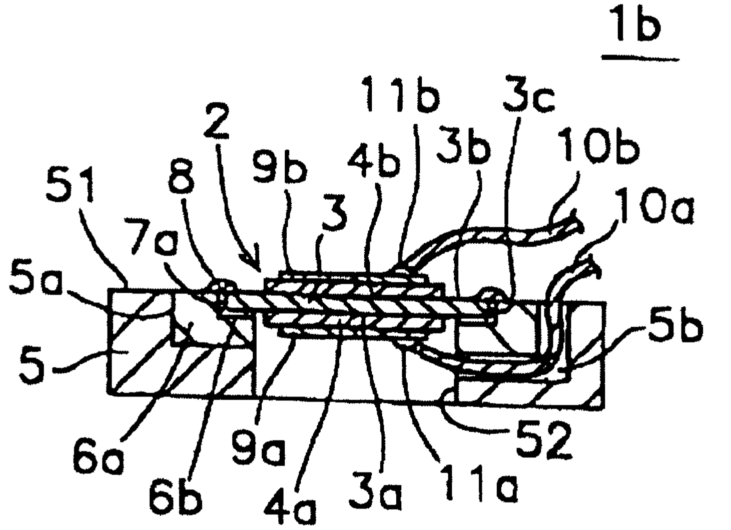
FIG. 4 is a cross-sectional view of the speaker of FIG. 3.

In the speaker 1*b* shown in FIG. 3 and FIG. 4, a ring-shaped adhesive member 8 is provided so as to define a reinforcing member which preferably extends completely around a portion of the second main surface 3*b* of the metal plate 3, which extends over the vibrator 2, and the adhesive member 7*a* and the cushioning material 6*a*. Furthermore, the adhesive member 8 is preferably made of the same material as the adhesive member 7*a* and is similarly elastic.

In the speaker 1*b* having such a unique arrangement and construction, when the adhesive member 8 is provided in addition to the adhesive member 7*a*, the vibrator 2 is more strongly and reliably secured to the cushioning material 6*a*. As a consequence, separation and peeling of the vibrator 2 from the cushioning material 6*a* is prevented when the speaker 1*b* is used as a woofer of audio equipment and the vibrator 2 vibrates with comparatively large amplitude, or when the vibrator 2 expands or shrinks due to heat.

Furthermore, since the elastic adhesive member 8 is preferably made of the same material as the adhesive member 7*a*, there is no danger that the adhesive member 8 will interfere with or obstruct the vibrations of the vibrator 2. Since the adhesive members 7*a* and 8 have the same thermal expansion coefficient, they do not crack when they expand or shrink due to heat.

Figure 5:
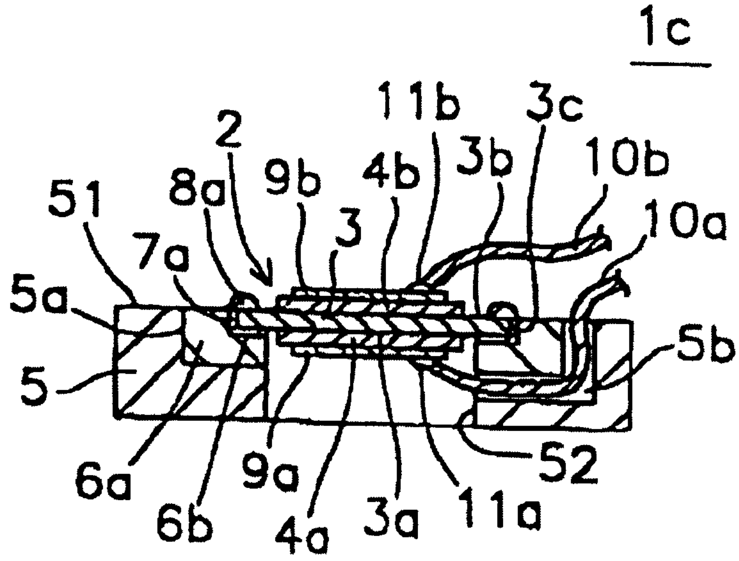
FIG. 5 is a cross-sectional view of a modification of the speaker of FIG. 3.

Next, a speaker according to a modification of the above second preferred embodiment will be explained. In FIG. 5, the same reference characters are used for the same or corresponding elements as those shown in FIG. 4, and detailed explanation of the same elements is omitted.

In the speaker 1*c* shown in FIG. 5, an adhesive member 8*a* preferably made of the same material as the adhesive member 7*a*, is arranged to extend completely around a portion of the second main surface 3*b* of the metal plate 3, which extends over the vibrator 2, and the adhesive member 7*a* defines a reinforcing member for preventing peeling of the vibrator 2. In the speaker 1*d* having such a unique arrangement and construction, less adhesive is used than in the speaker 1*b* shown in FIG. 4, thereby reducing the manufacturing cost.

In the second preferred embodiment and its modification described above, an adhesive member is preferably arranged to have a substantially ring-shape configuration extending completely around the portion of the other main surface of the metal plate, which extends over the vibrator, the adhesive member and the cushioning material, or alternatively, completely around the portion of the second main surface of the metal plate, which extends over the vibrator, and the adhesive member, so as to define a reinforcing member for preventing peeling of the vibrator. However, the adhesive member may be arranged partially around such a portion.

According to the speaker of preferred embodiments of the present invention, a step is provided in a cushioning material which is secured to a supporting member, and a side of a first main surface of a metal plate which defines a vibrator clips into the step in the cushioning member, thereby making it easy to position the vibrator during assembly of the speaker.

Furthermore, since the vibrator is more strongly and reliably secured to the cushioning material by providing an adhesive member on a portion of the second main surface of the metal plate, which extends over the vibrator, the adhesive member and the cushioning material, or alternatively, a portion of the second main surface of the metal plate, which extends over the vibrator, when the vibrator vibrates with comparatively large amplitude, or when the vibrator expands or shrinks due to heat, peeling and separation of the vibrator from the cushioning material is prevented.

Furthermore, when an adhesive member which is made of the same material as the adhesive member which affixes the cushioning material to the first main surface of the metal plate is provided to define a reinforcing member, since these adhesive members preferably have the same thermal expansion coefficient, the adhesive members do not crack when they expand or shrink due to heat.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A speaker comprising:

a vibrator including a first piezoelectric element, a second piezoelectric element and a metal plate having a rim and a first main surface and a second main surface, the first piezoelectric element being mounted on the first main surface of the metal plate and the second piezoelectric element being mounted on the second main surface of the metal plate;

a supporting member having a step portion defined in a surface thereof and arranged to support the vibrator; and a cushioning member having a step portion defined in a surface thereof, the cushioning member being secured in the step portion of the supporting member; wherein the metal plate is affixed to the cushioning member and the vibrator is secured to the supporting member, the rim of the metal plate and a portion of the first surface of the metal plate located near the rim are secured in the step portion of the cushioning member via an adhesive member provided in the step portion of the cushioning member.

2. A speaker according to claim 1, wherein a reinforcing member is provided at a location extending over the second main surface of the metal plate, the adhesive member and the cushioning member.

3. A speaker according to claim 2, wherein the adhesive member and the reinforcing member are made of the same material.

4. A speaker according to claim 1, wherein a reinforcing member is provided at a location extending over the second main surface of the metal plate and the adhesive member.

5. A speaker according to claim 4, wherein the adhesive member and the reinforcing member are made of the same material.

6. A speaker according to claim 1, wherein the adhesive member is disposed completely along surfaces of the metal plate and the step portion of the cushioning member which are in contact with each other.

7. A speaker according to claim 1, wherein the adhesive member is an elastic adhesive member.

8. A speaker according to claim 2, wherein the reinforcing member is substantially ring-shaped adhesive member.

9. A speaker according to claim 4, wherein the reinforcing member is substantially ring-shaped adhesive member.

10. A speaker according to claim 2, wherein the reinforcing member extends completely around a portion of the second main surface of the metal plate which extends over the vibrator, the adhesive member and the cushioning material.

11. A speaker according to claim 4, wherein the reinforcing member extends completely around a portion of the second main surface of the metal plate which extends over the vibrator, the adhesive member and the cushioning material.

12. A speaker comprising:

a vibrator including a first piezoelectric element, a second piezoelectric element and a metal plate and a first main surface and a second main surface, the first piezoelectric element being mounted on the first main surface of the metal plate and the second piezoelectric element being mounted on the second main surface of the metal plate;

a supporting member having a step portion defined in a surface thereof and arranged to support the vibrator; and a cushioning member having a step portion defined in a surface thereof, the cushioning member being secured in the step portion of the supporting member; wherein the metal plate is affixed to the cushioning member and the vibrator is secured to the supporting member, a portion of the metal plate is secured in the step portion of the cushioning member via an adhesive member provided in the step portion of the cushioning member.

13. The speaker according to claim 12, wherein the metal plate includes a rim and the rim of the metal plate is secured in the step portion of the cushioning member.

14. The speaker according to claim 12, wherein the metal plate includes a rim and the rim of the metal plate and a portion of the first main surface of the metal plate located near the rim are secured in the step portion of the cushioning member.

15. A speaker according to claim 12, wherein a reinforcing member is provided at a location extending over the second main surface of the metal plate, the adhesive member and the cushioning member.

16. A speaker according to claim 15, wherein the adhesive member and the reinforcing member are made of the same material.

17. A speaker according to claim 12, wherein a reinforcing member is provided at a location extending over the second main surface of the metal plate and the adhesive member.

18. A speaker according to claim 17, wherein the adhesive member and the reinforcing member are made of the same material.

* * * * *